US008198116B2

(12) United States Patent
Chen et al.

(10) Patent No.: US 8,198,116 B2
(45) Date of Patent: Jun. 12, 2012

(54) FABRICATION METHOD FOR THERMOELECTRIC DEVICE

(75) Inventors: Lidong Chen, Shanghai (CN); Monika Backhaus-Ricoult, Horseheads, NY (US); Lin He, Horseheads, NY (US); Xiaoya Li, Shanghai (CN); Xugui Xia, Shanghai (CN); Degang Zhao, Shanghai (CN)

(73) Assignees: Corning Incorporated, Corning, NY (US); Shanghai Institute of Ceramics, Shanghai (CN)

( * ) Notice: Subject to any disclaimer, the term of this patent is extended or adjusted under 35 U.S.C. 154(b) by 296 days.

(21) Appl. No.: 12/644,712

(22) Filed: Dec. 22, 2009

(65) Prior Publication Data
US 2010/0167444 A1  Jul. 1, 2010

(30) Foreign Application Priority Data
Dec. 26, 2008 (CN) .......................... 2008 1 0207957

(51) Int. Cl.
  *H01L 21/04* (2006.01)
(52) U.S. Cl. ........ 438/54; 257/467; 136/236.1; 136/201
(58) Field of Classification Search .................... 438/54, 438/55; 136/201, 236.1, 237–240
See application file for complete search history.

(56) References Cited

U.S. PATENT DOCUMENTS

| 6,005,182 | A | 12/1999 | Imanishi et al. | 136/201 |
|---|---|---|---|---|
| 6,127,619 | A | 10/2000 | Xi et al. | 136/203 |
| 6,297,441 | B1* | 10/2001 | Macris | 136/201 |
| 6,441,295 | B2* | 8/2002 | Hiraishi et al. | 136/201 |
| 6,563,039 | B2 | 5/2003 | Caillat et al. | 136/205 |
| 6,759,586 | B2 | 7/2004 | Shutoh et al. | 136/205 |
| 7,321,157 | B2* | 1/2008 | Chen et al. | 257/467 |
| 2002/0024154 | A1 | 2/2002 | Hara et al. | 257/930 |
| 2007/0044828 | A1* | 3/2007 | Iwanade et al. | 136/230 |
| 2007/0221264 | A1 | 9/2007 | Shutoh et al. | 136/224 |
| 2008/0017236 | A1* | 1/2008 | Perlo et al. | 136/201 |
| 2008/0023057 | A1 | 1/2008 | Nakajima et al. | 136/201 |
| 2008/0173344 | A1* | 7/2008 | Zhang et al. | 136/238 |
| 2009/0293930 | A1* | 12/2009 | Yang et al. | 136/236.1 |
| 2010/0071741 | A1* | 3/2010 | Yang et al. | 136/240 |
| 2010/0319746 | A1* | 12/2010 | Snyder et al. | 136/201 |

FOREIGN PATENT DOCUMENTS

CN     101114692 A     1/2008
(Continued)

OTHER PUBLICATIONS

DiSalvo, et al "Thermoelectric Cooling and Power Generation", Science 285, 703 (1999).
M. Orihashi, et al "Ni/n-PbTe and Ni/p-$Pb_{0.5}$Te Joining by Plasma Activated Sintering", $17^{th}$ Int'l Conf on Thermoelectrics (1998).

(Continued)

*Primary Examiner* — Savitr Mulpuri
(74) *Attorney, Agent, or Firm* — Michael W. Russell

(57) ABSTRACT

A method for fabricating thermoelectric device is provided. The method comprises placing a first electrode in a die, forming a first interlayer on an upper surface of the first electrode; positioning a separating plate on an upper surface of the first interlayer to divide an inner space of the die into a plurality of cells, and depositing a first thermoelectric material on the first interlayer within a first fraction of the cells, and depositing a second thermoelectric material on the first interlayer within a second fraction of the cells, sintering the die contents, and removing the separating plate after sintering to obtain a π shaped thermoelectric device.

11 Claims, 1 Drawing Sheet

FOREIGN PATENT DOCUMENTS

| | | |
|---|---|---|
| GB | 1204884 | 2/1967 |
| JP | 04199755 | 7/1992 |
| JP | 11-195817 | 7/1997 |

OTHER PUBLICATIONS

Hasezaki, et al "Thermoelectric Semiconductor and Electrode-Fabrication and Evaluation and SiGe/Electrode", 16th Int'l Conference on Thermoelectrics (1997).

Nolas, et al "Effect of partial void filling on the lattice thermal conductivity of skutterudites", Physical Review B. vol. 58, No. 1, Jul. 1, 1998-1.

Rowe, et al "Evaluation of thermoelectric modules for power generation," J. of Power Fources 73 (1998) pp. 193-198.

Fan, et al "Joining of Mo to $CoSb_3$ by spark plasma sintering by inserting a Ti interlayer," Materials Letters 589 (2004) 3876-3878.

* cited by examiner

FABRICATION METHOD FOR THERMOELECTRIC DEVICE

PRIORITY

This application claims priority to Chinese Patent Application number 200810207957.8, filed Dec. 26, 2008, titled "Method For Fabricating Thermoelectric Device."

FIELD OF THE INVENTION

The present disclosure relates to a method for fabricating a thermoelectric device, and more specifically to a method for fabricating a thermoelectric device comprising a filled skutterudite.

BACKGROUND

The electricity generation by thermoelectricity is a technique utilizing Seebeck effects in semiconductor materials for realizing direct conversion from heat to electricity, which is characterized by long lifespan, high reliability, safe environment, etc. It has wide applications and potential social and economic effects in areas of electricity generation by photoelectricity and thermoelectricity, solar energy, and electricity generation by industrial waste heat. Improving the figure of merit of thermoelectric materials can be beneficial in improving energy conversion efficiency of thermoelectric electricity generation. Therefore, studies in the field of thermoelectric conversion focus on developing new thermoelectric materials with high performance. In another aspect, processes of researching and developing new thermoelectric material devices is of equal importance for improving energy conversion efficiency of thermoelectric electricity generation.

Thermoelectric devices mainly comprise two types of thermoelectric semiconductor elements, i.e. p-type and n-type. Since the voltage of a single thermoelectric device can be limited, electrodes are usually used to have a variety of p-type and n-type thermoelectric components connected in series for electrical conduction or connected in parallel for thermal conduction to construct a thermoelectric electricity generation module, thereby to acquire a higher voltage for selected applications. The choice of electrode materials and the combination thereof with thermoelectric elements are considerations in the manufacture of thermoelectric devices. Recently, $Bi_2Te_3$-based devices at a low temperature have been commercialized, commonly having copper as electrodes and adopting traditional soldering technique for welding. With respect to devices at an intermediate and high temperature, firstly, it is desirable that the coefficients of thermal expansion (CTE) of electrode material match with the thermoelectric material for choosing an electrode material, so as to reduce the thermal stress as much as possible during fabricating and using the devices, and to avoid failure in welding the electrode or invalidity during using the devices due to excessive thermal stress. Secondly, good electrical conductivities and thermal conductivities are desirable for the electrode material in order to reduce adverse impacts on device performance, such as energy conversion efficiency, due to the electric resistance and thermal resistance incurred by the electrode.

Filled skutterudite is regarded as a new thermoelectric material in an intermediate temperature with high performance, which has a promising future of application. A technique for welding $Bi_2Te_3$ devices is borrowed for welding electrodes on a low temperature side of a filled skutterudite device, where copper is chosen as the electrode material and the technique of tin soldering is adopted for welding. With respect to welding electrodes in a high temperature of filled skutterudite devices, according to existing reports, Cu, Mo, Ni—Cr, W, Ta, and their alloys, stainless steel (U.S. Pat. No. 6,005,182), Ag, Ag—Au, Ag—Cu, Fe (U.S. Pat. No. 6,759,586) and Nb (U.S. Pat. No. 6,563,039) are chosen as electrode materials, while copper brazing (U.S. Pat. No. 6,005,182, US 2002/0024154, CN 101114692, etc.), silver brazing (U.S. Pat. No. 6,759,586, US 2008/0023057, etc.), sintering (US 2006/0017170, U.S. Pat. No. 6,563,039, JP11195817, etc.) and the like are adopted as joining methods for electrodes and skutterudite materials.

Table 1 lists thermal expansion coefficients (CTEs), electrical conductivities and thermal conductivities of filled skutterudite and metallic materials. It can be seen that simple metals, except Ti, Fe, and Ni that have a CTE close to that of filled skutterudite, show large differences in CTE than filled skutterudite, while Ti, Fe and Ni exhibit much lower electrical conductivity and thermal conductivity than Cu, Mo, etc. Stainless steel, which mainly composes of Fe, Cr, Ni, etc., has a CTE closest to that of the filled skutterudite material. In addition, it is observed that Mo has a smaller CTE than the filled skutterudite material while Cu has a larger CTE than filled skutterudite. When Mo and Cu are combined into alloy, the alloy may have CTE close to that of filled skutterudite material by adjusting relative proportion of the two, and may also maintain good electrical conductivity and thermal conductivity of Cu and Mo. W and Cu are quite the same.

Recently, a commonly-adopted method for fabricating thermoelectric devices (for example, the method for fabricating thermoelectric devices recorded in Chinese patent application No. 200710044771.0) is mainly characterized by (i) first fabricating (sintering) a bulk element of a thermoelectric device in a die, (ii) welding an electrode at a high temperature onto the bulk element, (iii) welding the side at a low temperature with a ceramic plate by solders, and (iv) forming a π shaped device by cutting or the like. However, the existing method is not only complex, but also inevitably exposes thermoelectric materials (such as filled skutterudite) again to heat and pressure with a risk of degrading the performance of thermoelectric materials. Therefore, it is in urgent need of developing a new method for fabricating devices to simplify processing procedures and avoid adverse impacts on thermoelectric materials.

TABLE 1

CTE, electrical conductivity, and thermal conductivity of materials

| Material | CTE (RT~875K) ($\times 10^{-6} K^{-1}$) | electrical conductivity ($\times 10^6 \Omega^{-1} m^{-1}$) | thermal conductivity (W/mK) |
|---|---|---|---|
| $CoSb_3$ based skutterudite | 10-11 | P: 0.062-0.073<br>N: 0.11-0.23(RT~850K) | P: 2.1-2.6<br>N: 2.2-3.0(RT~850K) |
| Mo | 5.6-6.2 | 18.1 | 138 |
| Cu | 18 | 59.6 | 334 |
| W | 4.5-4.6 (RT~100) | 18.9 | 138 |

TABLE 1-continued

CTE, electrical conductivity, and thermal conductivity of materials

| Material | CTE (RT~875K) ($\times 10^{-6}$ K$^{-1}$) | electrical conductivity ($\times 10^{6}\Omega^{-1}$ m$^{-1}$) | thermal conductivity (W/mK) |
|---|---|---|---|
| Ti | 8.4-8.6 (RT~100) | 1.9 | 21 |
| Ni | 13 (RT~100) | 16 | 82.8 |
| Fe | 12-13 (RT~100) | ~4 | 37 |
| Ag | 19 (RT~100) | 62.9 | 429 |
| Ta | 6.5 (RT~100) | 8.03 | 57.5 |
| Nb | 7.2-7.3 (RT~100) | 8 | 53.7 |
| stainless steel | 10-13 (RT~100) | 1.5-2.5 | 14-16 |
| $Mo_{50}Cu_{50}$ | 10.5~9.5 | 37.1 | 230-270 |
| $Mo_{70}Cu_{30}$ | 8.9~8.5 | 22.3 | 170-200 |
| WCu alloy | 9.0 | 54.3 | 220-230 |

SUMMARY OF THE INVENTION

One purpose of the present disclosure is to provide a relatively simple method for fabricating a thermoelectric device. A method for fabricating thermoelectric device comprises (i) placing a first electrode in a die, (ii) forming a first interlayer on an upper surface of the first electrode, (iii) positioning a separating plate on an upper surface of the first interlayer to divide an inner space of the die into a plurality of cells, and depositing a first thermoelectric material on the first interlayer within a first fraction of the cells, and depositing a second thermoelectric material on the first interlayer within a second fraction of the cells, (iv) sintering the die contents; and (v) removing the separating plate after sintering to obtain a π shaped thermoelectric device.

According to embodiments, after the π shaped thermoelectric device is obtained, a plurality of π shaped thermoelectric devices are welded to a copper-coated ceramic plate to form an entire body.

According to one preferred embodiment, the step of welding a plurality of shaped thermoelectric devices to the copper-coated ceramic plate to form an entire body further comprises providing a second interlayer and a tin soldering layer sequentially on one side of the plurality of π shaped thermoelectric devices, and welding to the copper-coated ceramic plate.

In the above mentioned embodiment, the first interlayer comprises a joint enhancement layer in contact with the first electrode; and a barrier layer in contact with the joint enhancement layer.

In the above mentioned embodiment, the step of sintering the die contents further comprises sintering the die contents with electricity in a spark plasma apparatus. According to a preferred embodiment, the step of sintering comprises sintering under a pressure of 30-60 MPa and a sintering temperature of 550-680° C.

According to a preferred embodiment, the separating plate comprises one or several materials of $ZrO_2$, $Al_2O_3$, MN, $SiO_2$, glass, graphite, Ni, Cu, Fe and stainless steel.

According to a preferred embodiment, the first electrode comprises binary or ternary alloys or composite materials, wherein the first metal is selected from Cu, Ag, Al or Au, and the second metal is selected from Mo, W, Zr, Ta, Cr, Nb, V or Ti.

According to a more preferred embodiment, the first electrode comprises metal alloys or composite materials, selected from molybdenum-copper alloys with a general formula $Mo_xCu_{1-x}$, in which x (weight %) is 20≦x≦80, or tungsten-copper alloys with a general formula $W_xCu_{1-x}$, in which x (weight %) is 50≦x≦90.

According to an embodiment, the first thermoelectric materials comprise n-type thermoelectric materials selected from n-$CoSb_3$, n-PbTe or n-$Zn_4Sb_3$, and the second thermoelectric materials comprise p-type thermoelectric materials selected from p-$CoSb_3$, p-PbTe or p-$Zn_4Sb_3$.

According to another embodiment, the additional steps of providing a second interlayer on the first thermoelectric materials and the second thermoelectric material, and providing a second electrode on the second interlayer may be included between the steps of inserting and sintering.

According to the another embodiment, the second electrode comprises metal alloys or composite materials, selected from molybdenum-copper alloys with a general formula $Mo_xCu_{1-x}$, in which x (weight %) is 20≦x≦80, or tungsten-copper alloys with a general formula $W_xCu_{1-x}$, in which x (weight %) is 50≦x≦90.

According to another embodiment, the step of providing the first layer or the second layer can be performed by plasma spraying, flame spraying, arc spraying or electroplating.

According to another embodiment, after the π shaped thermoelectric device is obtained, a plurality of π shaped thermoelectric devices are welded to a copper-coated ceramic plate to form an entire body.

According to another embodiment, coefficients of thermal expansion of the first electrode and the second electrode are close to those of the filled first thermoelectric material and second thermoelectric material.

The present disclosure embraces advantages of obtaining π shaped elements with one-step sintering and simplified procedures for obtaining π shaped elements, with minimal adverse impacts on performance of filled thermoelectric materials resulted from exposing filled thermoelectric materials to heat and pressure for a second time.

It should be understood that the forgoing general description and following detailed description of the present invention are exemplary and explanatory, and intend to provide further interpretations for the present invention according to the claims.

BRIEF DESCRIPTION OF THE DRAWINGS

The drawings provided for further understanding of the present invention are included and embodied as part of the present application, which illustrate embodiments of the present invention and interpret principles of the present invention in company with the specification. In the figures.

DETAILED DESCRIPTIONS

A method for fabricating filled skutterudite thermoelectric devices with high efficiency and reliability for electricity generation is provided. An embodiment of the method includes placing a pretreated hot end electrode, a joint enhancement layer, and a barrier layer into a die sequentially, placing p/n filled skutterudite powder, and then placing a barrier layer, a joint enhancement layer and a cold end electrode sequentially, performing a spark plasma sintering to obtain a π shaped element, and soldering a plurality of π shaped elements to a ceramic plate to form a filled skutterudite device.

Detailed descriptions will be made in conjunction with the accompanying drawings. It shall be noted that skutterudite is taken as an exemplary thermoelectric material in the following description of all embodiments. It should be understood by those skilled in the art that skutterudite in the following embodiments may be replaced by other known thermoelectric materials.

First Embodiment

Figures 1A, 1B, 1C, 1D:
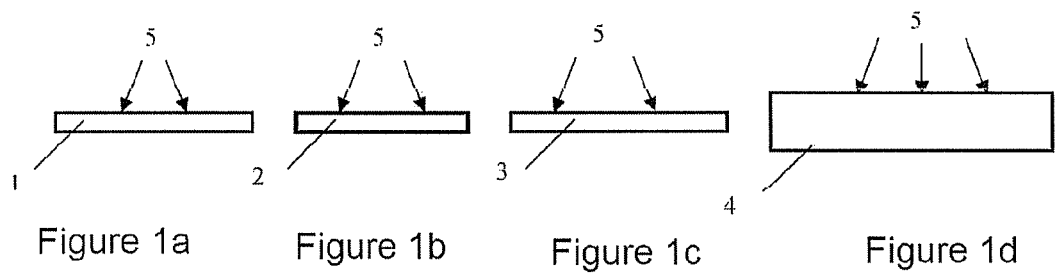
FIGS. 1a-1d illustrate pretreatment of a barrier layer, a joint enhancement layer, a separating plate, and an electrode.

With reference to FIG. 1, a process of pretreatment 5 is performed. As shown in FIGS. 1a-1d, sand spraying or ultrasonic cleaning is performed on a barrier layer 1, a joint enhancement layer 2, a separating plate 3, and an electrode 4 to remove surface oxides or other impurities and to create roughness on the surface of electrode 4. Pretreatment is preferably performed with high purity quartz sand under spray pressure of 0.1-0.5 MPa for 30 sec to 3 min, and the time for ultrasonic cleaning may be 5-15 min.

Figure 2:
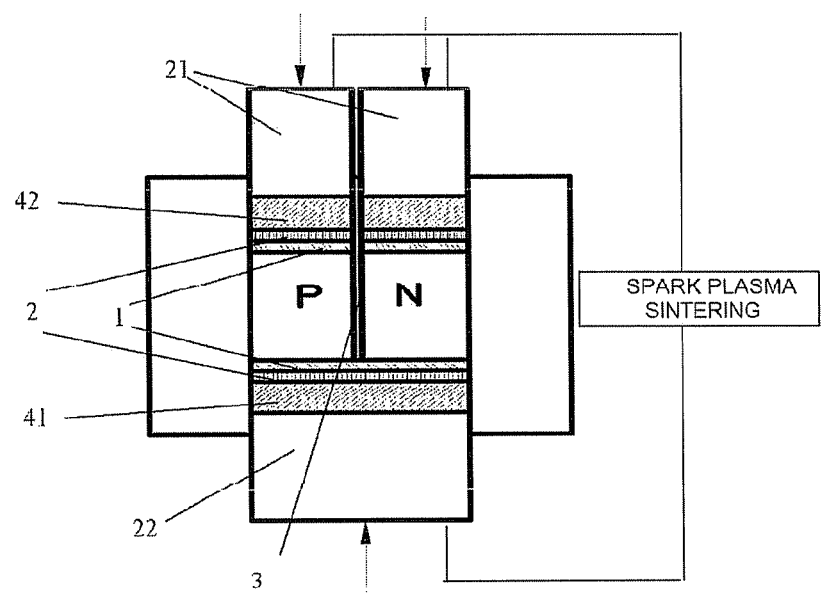
FIG. 2 illustrates a schematic of forming a π shaped device by spark plasma sintering according to an embodiment.

Next, referring to FIG. 2, a process of filling and sintering is performed. A hot end electrode 41, a joint enhancement layer 2a, and a barrier layer 1a are provided in a die sequentially. The joint enhancement layer 2a and the barrier layer 1a may be placed in a simple manner, or may adopt techniques such as plasma spraying, flame spraying, arc spraying or electroplating. Of course, there is no specific limitation on the placement, so that any placements known by those skilled in the art may be adopted. Next, a separating plate 3 is vertically inserted on an upper side of the hot end electrode 41, which divides the die into two cells, in order to place p-type thermoelectric materials and n-type thermoelectric materials into either cell separately, for example, filling p/n filled skutterudite powder according to a preferred embodiment. Then, a barrier layer 1b, a joint enhancement layer 2b and a cold end electrode 42 are placed sequentially on the thermoelectric materials. The stacked structure is pre-pressed via an upper pressing head 21 and a lower pressing head 22. Next, the die contents are sintered. In the embodiment illustrated in FIG. 2, for example, the die is placed into a spark plasma sintering equipment for sintering. Therefore, the formation of a bulk of the p/n filled skutterudite powder and its combination with the electrode are completed at the same time.

In the embodiments above, for both hot end electrodes and cold end electrodes, it is preferred to select metallic materials that have CTE match with the selected thermoelectric materials and have good electrical and thermal conductivities. For example, metallic materials (e.g., Mo, W, Zr, Ta, Cr, Nb, V, Ti, etc.), which have CTE lower than that of skutterudites, are combined with metallic materials (e.g., Cu, Ag, Al, Au, etc.), which have CTE higher than that of filled skutterudites and have good electrical and thermal conductivities, to form binary or ternary materials. The combination method can be melting or rolling after sintering. The preferred thickness of the electrodes might be 0.5-1.5 mm. The hot end electrodes and the cold end electrodes mentioned above may be selected from molybdenum-copper alloys with a general formula $Mo_xCu_{1-x}$, in which x (weight %) is $20 \leq x \leq 80$, or tungsten-copper alloys with a general formula $W_xCu_{1-x}$, in which x (weight %) is $50 \leq x \leq 90$.

Moreover, the separating plate 3 mentioned above may be selected from one or of several materials including $ZrO_2$, $Al_2O_3$, AN, $SiO_2$, glass, graphite, Ni, Cu, Fe and stainless steel. The preferred thickness of the separating plate 3 might be 0.2-1.0 mm.

By way of example, n-type thermoelectric materials may be selected from n-$CoSb_3$, n-PbTe and n-$Zn_4Sb_3$, and p-type thermoelectric materials may be selected from p-$CoSb_3$, p-PbTe and p-$Zn_4Sb_3$.

Generally, the barrier layers 1a,1b are configured to inhibit diffusion, which may cause performance degradation. The joint enhancement layers 2a,2b are configured to enhance combination between materials. Consequently, although the two layers are deposited simultaneously in the above mentioned embodiments, either the barrier layer or the joint enhancement layer may be deposited as required to serve as an interlayer between the electrode and the thermoelectric material. The joint enhancement layers 2a,2b and the bather layers 1a,1b may include a Ag alloy solder, a copper alloy solder, or a Ag—Cu alloy solder plus Ti foil. Preferably, the thickness of the solder is in the range of 80-150 microns and the thickness of Ti foil is 30-100 microns. The joint enhancement layers 2a,2b and the barrier layers 1a,1b can also be Ti powder with purity no less than 98% and particle size of 100-500 microns. It is not necessary to pre-treat the Ti powder. Ti powder can be placed directly on top of the electrode with thickness ranging from 20 to 100 microns. Particularly, a single interlayer may be provided to function as joint enhancement layer/barrier layer. In this situation, the single interlayer may be Ti powder, Al powder, or mixed power or alloy power of the two.

Preferably, the above mentioned pre-pressure is 5-10 MPa, and sintering parameters are vacuum=1-10 Pa, sintering pressure=30-60 MPa, heating rate=50-200° C./min, sintering temperature=550-680° C., hold time=5-10 minutes.

The above-mentioned cold-end electrode can include metallic materials or metal composites materials which have good CTE match with filled skutterudite and have good electrical and thermal conductivities, and also have good wetting with tin solder for fabricating tin soldering layer.

Figures 3A, 3B:
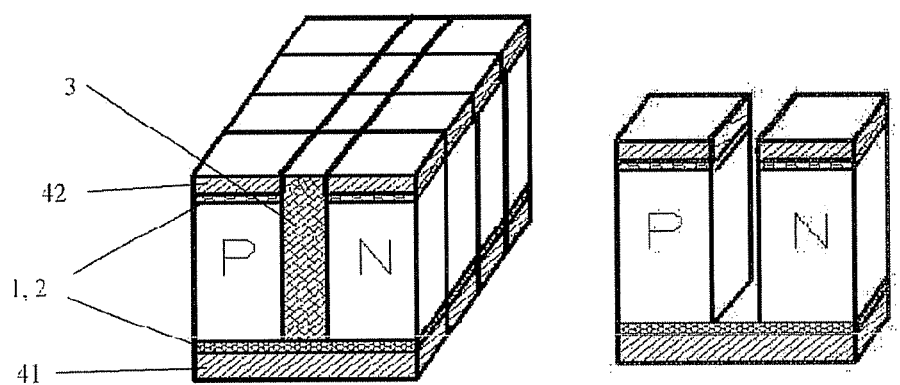
FIG. 3a illustrates π shaped devices prior to removal of separating plates.
FIG. 3b illustrates a single π shaped device after removal of the separating plate.

The separating plate 3 may be removed after sintering. Thus, the π shaped device is obtained after removal of the separating plate preferably by line cutting. FIGS. 3a and 3b illustrate π shaped thermoelectric devices before and after removal of the separating plate, respectively. Of course, it can be understood that any suitable removal method may be adopted.

According to one preferred embodiment, the sintering die may be designed to sinter several π shaped thermoelectric devices at the same time, particularly for improvement of efficiency, as illustrated in FIG. 3a. That is, at the step of inserting the separating plate 3, whole space of the die is divided into several cells, e.g., eight cells in the embodiment as illustrated in FIG. 3a. Of the several cells, p-type thermoelectric materials are deposited within some cells while n-type thermoelectric materials are deposited within other cells respectively. In such situation, it can be understood by those skilled in the art that a plurality of π shaped thermoelectric devices can be simultaneously fabricated by one-step sintering through similar procedures.

Finally, a plurality of π shaped thermoelectric devices can be welded to a copper-coated ceramic plate. Specifically, a tin soldering layer can be fabricated onto the cold end electrode of a π shaped thermoelectric device before welding, and then the π shaped thermoelectric device can be welded to a copper-coated ceramic plate covered with tin.

Second Embodiment

As compared to the first embodiment, the main distinction of the second embodiment is in the omission of a barrier layer, joint enhancement layer and cold end electrode prior to sintering. Consequently, the descriptions of same steps as those in the first embodiment are omitted below.

According to the second embodiment, during the filling process in the first embodiment, the barrier layer 1b, the joint enhancement layer 2b and the cold end electrode 42 are not inserted after adding p/n filled skutterudite powder, rather, the upper pressing head 21 is placed directly into contact with an upper surface of the thermoelectric powders, and a π shaped element without cold end electrode is obtained after sintering.

With respect to the π shaped element without sintering the cold end electrode, a barrier layer, a joint enhancement layer and a tin soldering layer may be fabricated on the cold side before welding the π shaped element to a copper-coated ceramic plate. And then, thermoelectric devices are obtained when the π shaped elements are welded with the copper-coated ceramic plate. The barrier layer can be a Mo metal layer with a thickness in the range of 10-80 microns, which can be fabricated by plasma spray coating. The enhancement layer can be a Ni metal layer with a thickness in the range of 10-100 microns, which can be fabricated by plasma spraying, flame spraying or electroplating. The tin soldering layer can have a thickness in the range of 100-500 microns, which may be fabricated by tin dipping or electroplating.

In summary, one obvious character of the disclosed embodiments is that the processes of forming bulk thermoelectric materials and combining with hot end electrodes are completed simultaneously, to thereby avoid adverse impacts on exposing thermoelectric materials due to heat and pressure for a second time caused by welding hot end electrode of the thermoelectric device.

It can be readily appreciated by those skilled in the art that any variations and modifications of the foregoing exemplary embodiments can be made without departing from the spirit and scope of the disclosure. Therefore, these variations and modifications shall be construed as fall within the scope of appended claims and equivalent technical solutions thereof.

What is claimed is:

1. A method for fabricating a thermoelectric device, comprising:
   placing a first electrode in a die;
   forming a first interlayer on an upper surface of the first electrode;
   positioning a separating plate on an upper surface of the first interlayer to divide an inner space of the die into a plurality of cells, and depositing a first thermoelectric material on the first interlayer within a first fraction of the cells, and depositing a second thermoelectric material on the first interlayer within a second fraction of the cells, wherein the first thermoelectric material comprises n-type thermoelectric material selected from n-CoSb3, n-PbTe and n-Zn4Sb3, and the second thermoelectric material comprises p-type thermoelectric material selected from p-CoSb3, p-PbTe and p-Zn4Sb3
   forming a second interlayer on the first thermoelectric material and the second thermoelectric material;
   forming a second electrode on the second interlayer;
   sintering the die contents; and
   removing the separating plate after sintering to obtain a π shaped thermoelectric device, wherein after the r~shaped thermoelectric device is obtained, welding a plurality of~shaped thermoelectric devices to a copper-coated ceramic plate to form an entire body.

2. The method of claim 1, wherein the step of welding a plurality of π shaped thermoelectric devices to the copper-coated ceramic plate further comprises providing a second interlayer and a tin soldering layer sequentially on one side of the plurality of π shaped thermoelectric devices, which are then welded with the copper-coated ceramic plate.

3. The method of claim 1, wherein the first interlayer comprises:
   a joint enhancement layer in contact with the first electrode; and
   a barrier layer in contact with the joint enhancement layer.

4. The method of claim 1, wherein the step of sintering comprises:
   sintering the die contents with electricity in a spark plasma apparatus.

5. The method of claim 1, wherein the step of sintering is performed under a pressure of 30-60 MPa and a sintering temperature of 550-680° C.

6. The method of claim 1, wherein the separating plate comprises one or more of $ZrO_2$, $Al_2O_3$, AlN, $SiO_2$, glass, graphite, Ni, Cu, Fe, and stainless steel.

7. The method of claim 1, wherein the first electrode comprises binary or ternary alloys or composite material that include a first metal selected from Cu, Ag, Al or Au, and a second metal selected from Mo, W, Zr, Ta, Cr, Nb, V or Ti.

8. The method of claim 1, wherein the first electrode comprises metal alloys or composite material selected from molybdenum-copper alloys with a general formula $Mo_xCu_{1-x}$, in which x (weight %) is $20 \leq x \leq 80$, or tungsten-copper alloys with a general formula $W_xCu_{1-x}$, in which x (weight %) is $50 \leq x \leq 90$.

9. The method of claim 1, wherein the second electrode comprises metal alloys or composite material selected from molybdenum-copper alloys with a general formula $Mo_xCu_{1-x}$ in which x (weight %) is $20 \leq x \leq 80$, or tungsten-copper alloys with a general formula $W_xCu_{1-x}$, in which x (weight %) is $50 \leq x \leq 90$.

10. The method of claim 1, wherein the step of forming the first interlayer or the step of forming the second interlayer is performed by plasma spraying, flame spraying, arc spraying or electroplating.

11. The method of claim 1, wherein coefficients of thermal expansion of the first electrode and the second electrode are substantially equal to those of the first thermoelectric material and second thermoelectric material.

* * * * *